United States Patent
Creek

(10) Patent No.: US 6,323,694 B1
(45) Date of Patent: *Nov. 27, 2001

(54) DIFFERENTIAL COMPARATOR WITH A PROGRAMMABLE VOLTAGE OFFSET FOR USE IN AN AUTOMATIC TESTER

(75) Inventor: William Creek, Fremont, CA (US)

(73) Assignee: LTX Corporation, Westwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/053,714

(22) Filed: Apr. 1, 1998

(51) Int. Cl.[7] ........................................ H03K 5/22
(52) U.S. Cl. ............................ 327/69; 372/62; 372/74; 324/537; 324/555
(58) Field of Search .................. 327/58, 62, 63, 327/64, 65, 69, 70, 74, 76, 407, 415; 330/2, 9, 69; 324/537, 555

(56) References Cited

U.S. PATENT DOCUMENTS

| | | |
|---|---|---|
| 3,549,995 | 12/1970 | Trousdal et al. . |
| 3,631,229 | 12/1971 | Bems et al. . |
| 4,439,858 | 3/1984 | Petersen . |
| 4,517,512 | 5/1985 | Petrich et al. . |
| 4,523,312 | 6/1985 | Takeuchi . |
| 4,583,223 | 4/1986 | Inoue et al. . |
| 4,605,894 | 8/1986 | Cox et al. . |
| 4,623,799 | 11/1986 | Nyman, Jr. . |
| 4,636,716 | 1/1987 | Welzhofer . |
| 4,675,673 | 6/1987 | Oliver . |
| 4,694,242 | 9/1987 | Peterson et al. . |
| 4,720,671 | 1/1988 | Tada et al. . |
| 4,791,358 | 12/1988 | Sauerwald et al. . |
| 4,928,062 | 5/1990 | Miles et al. . |
| 4,937,472 | 6/1990 | Martin et al. . |

(List continued on next page.)

OTHER PUBLICATIONS

Gillette, Garry C., *A Single Board Test System: Changing the Test Paradigm*, IEEE (1995), Paper 37.2, pp. 880–885.
Garry C. Gillette, A Single Board Test System: Changing The Test Paradigm, International Test Conference, IEEE 1995, pp. 880–885.
Will Creek, Characterization of Edge Placement Accuracy in High–Speed Digital Pin Electronics, International Test Conference Proceedings 1993, Oct. 1993, pp. 556–565.
*Teradyne J971 System Description*, including articles, Jul. 30, 1991.

(List continued on next page.)

Primary Examiner—Kenneth B. Wells
Assistant Examiner—Terry L. Englund
(74) Attorney, Agent, or Firm—Blakely, Sokoloff, Taylor & Zafman LLP

(57) ABSTRACT

A test circuit operable to examine both differential outputs and single outputs of a device under test (DUT), the circuit comprises a first circuit having as inputs a first output of the DUT and a first set of independent reference voltages, and an output of the first circuit coupled to a plurality of comparators. The test circuit further comprises a second circuit having as inputs a second output of the DUT and a second set of independent reference voltages, and an output of the second circuit coupled to the plurality of comparators. The test circuit further comprises a select circuit coupled to outputs of the comparators, the output of the first circuit and the output of the second circuit. The select circuit outputting the outputs of the first circuit and the second circuit or outputting the outputs of the comparators.

21 Claims, 4 Drawing Sheets

U.S. PATENT DOCUMENTS

| | | | |
|---|---|---|---|
| 4,968,901 | * 11/1990 | Schacter | 327/74 |
| 5,086,271 | 2/1992 | Haill et al. . | |
| 5,200,696 | 4/1993 | Menis et al. . | |
| 5,331,210 | * 7/1994 | McCarroll | 327/58 |
| 5,408,143 | * 4/1995 | Gleim | 327/63 |
| 5,568,561 | * 10/1996 | Whitlock | 330/258 |
| 5,572,154 | 11/1996 | Rakers et al. . | |
| 5,701,102 | * 12/1997 | Kuo | 330/253 |
| 5,798,730 | * 8/1998 | Sanchez | 327/24 |
| 5,875,198 | 2/1999 | Satoh . | |

OTHER PUBLICATIONS

*Teradyne J971 System Description*, Teradyne, Inc., pp. 1–21 (May 1991).

*Teradyne J971 Preliminary Specification* (*100 MHz Version*), Teradyne, Inc. pp. 1–17 (Jun. 25, 1991).

*Teradyne J971 Articles* (Various dates).

H. Vitale, *High Speed CMOS Reflection Reduction*, Trillium Engineering, Trillium Applications Note No. APN 028 (Aug. 1998), pp 1–7.

Applications Note No. APN 028 (Aug. 1998), pp. 1–7.

J. Millman, *Microelectronics—Digital and Analog Circuits and Systems*, pp. 338–343 (1979).

*Mega One VLSI Test System Product Profile*, Megatest Corp., 3 pages (1983).

*Product Description*, Rev. 2, pp.33–34 (May 1986).

M. Ferland, *Device Output Loading*, IEEE, pp. 130–132 (1978).

H. Vitale, *Use of the Programmable Load to Reduce Reflections in Test Applications of High Speed CMOS*, Trillium Test Systems Applications Note (Oct. 1987), pp 1–2 and Figs 1–4.

*Motorola High–Speed CMOS Integrated Circuits*, Motorola, Inc., p. 4–4 (1983).

*Fairchild Advanced CMOS Technology Logic Data Book*, Fairchild Semiconductor Corp., pp. 2–3 to 2–7 (1987).

*J967 VLSI Test System*, Teradyne, Inc. p. 25 (May 1985).

D.F. Murray and C.M. Nash, *Critical Parameters for High-Performance Dynamic Repsonse Measurements*, 1990 International Test Conference, pp. 462–471.

*Teradyne J971 Spectrum Architecture*, Teradyne, Inc., pp. 1–35 (Nov. 28, 1990).

\* cited by examiner

DIFFERENTIAL COMPARATOR WITH A PROGRAMMABLE VOLTAGE OFFSET FOR USE IN AN AUTOMATIC TESTER

FIELD OF THE INVENTION

The present invention relates to an automatic tester. More particularly, the present invention relates to a differential comparator circuitry used to measure the timing properties of a device under test.

BACKGROUND

Test equipment is typically used to determine whether a device under test ("DUT") follows a set of timing specifications. Accordingly, timing accuracy plays a vital role in the design of test equipment because a discrepancy in the timing accuracy can result in an incorrect classification of a DUT. For example, in some testing environments, provided a DUT follows a set of predetermined timing specifications, the DUT is categorized as a valid device for sale. Typically to pass as a valid device, each pin of a given DUT must satisfy timing requirements such as valid time, hold time, and setup time. These timing requirements, however, are susceptible to both electrical noise and transmission noise.

To counteract the effect of noise, conventional testers add a guardband to timing measurements. The timing guardband ensures that pin timings are not a product of noise. One disadvantage of adding a guardband is that it results in the testing equipment failing valid devices. In particular, the guardband makes the timing specification more stringent, thus DUTs that pass the timing specification but fail the guardband requirements are classified as failing devices.

FIG. 1A illustrates a prior art testing device. In particular, test circuit 100 comprises two single-ended comparators (120 and 130) coupled to pin 110. Using the single-ended comparator, test circuit 100 determines pin 110's voltage transitions across a given threshold(s). As illustrated in FIG. 1A, each comparator is coupled to a different reference voltage. Comparator 120 is coupled to a high reference voltage CH 125. Similarly, comparator 130 is coupled to a low voltage CL 135. Accordingly, test circuit 100 determines whether pin 110 has crossed a high reference voltage or a low voltage.

Pin 110's transition across the high voltage reference is indicated on output 140. Similarly, pin 110's transition across the low voltage reference in indicated on output 150. For one embodiment, pin 110 is the output of a DUT. Accordingly, output 140 and output 150 indicate a logic high output and a logic low output, respectively.

FIG. 1B illustrates the timing of pin 110. In particular, the horizontal axis of timing chart 105 shows time ("t"). The vertical axis of timing chart 105 shows the voltage level of pin 110. The vertical axis of timing chart 105 also shows the voltage level of reference voltages CH 125 and voltage CL 135. The reference voltage levels CH 125 and CL 135 are used to determine logic low and logic high outputs, respectively. Accordingly, test circuit 100 recognizes pin 110 as a logic low for t<151 and t>158. Test circuit 100 also recognizes pin 110 as a logic high for 152<t<156.

Test circuit 100, however, is susceptible to noise. Test circuit 100 is susceptible to noise because the reference voltages CH 125 and CL 135 remain stable. On the other hand, the signal generated by pin 110 is affected by electrical noise and transmission reflections. Accordingly, the comparison of pin 110 to the steady reference values is skewed. For example, at time 157, noise creates a negative voltage shift on pin 110. The negative voltage shift delays the high to low transition of pin 110. Thus, a tester that excepts a logic low value on pin 110 prior to time 158 will incorrectly determine that the DUT does not follow timing specifications.

To counteract the effects of noise, some DUTs include differential outputs. Differential outputs are used because a voltage measurement based on the difference in the value between a pair of differential outputs is less susceptible to electrical noise and transmission line reflections. Conventional testers, however, have disadvantages when used in conjunction with differential outputs.

One disadvantage of using a conventional tester with differential outputs results when a common mode component exists in the differential output. Typically, a common-mode component offsets the signal transitions of a pair of differential outputs. The offset, however, corrupts the output of a single-ended comparator used in conventional testers. The corruption occurs because the single-ended comparator compares a single output versus a reference voltage. Accordingly, the single-ended comparator is unable to distinguish offset signal transitions that are readily apparent when compared against the signal transition of a related differential output.

To counteract the disadvantage of using a single-ended comparator, some prior art testers use a differential comparator. In particular, the differential comparator is coupled to a pair of differential outputs. One disadvantage of using a differential comparator results from the design characteristics of the differential comparator. In particular, a differential comparator determines whether a pair of signals is equal in value. Accordingly, if one of the differential outputs is erroneously held at a direct current ("DC") value while the other output transitions normally, the tester is unaware of the DC error. The tester is unaware of the DC error because the tester detects intervals where the DC output and the transitory signal intersect, thus the tester incorrectly assumes that both differential outputs are transitioning properly. Another disadvantage of using a differential comparator results from the introduction of capacitive coupling. In particular, when a pair of tester channels are used as inputs for a differential comparator, the differential comparator creates capacitive coupling between the channels. Capacitive coupling results in electrical and/or transmission noise between the channels, thus reducing timing accuracy in the tester circuit.

SUMMARY OF THE INVENTION

Therefore, it is an object of the present invention to provide a voltage offsettable differential comparator for use in test equipment.

A testing circuit is disclosed. The testing circuit is configured to examine a differential output of a device under test. The testing circuit includes an offsettable differential comparator coupled to the differential output of the device under test. The offsettable differential comparator generates a digital signal corresponding to a voltage difference on the differential output.

Other objects, features and advantages of the present invention will be apparent from the accompanying drawings and from the detailed description that follows.

BRIEF DESCRIPTION OF THE DRAWINGS

The features and advantages of the present invention are illustrated by way of example and not limited in the figures of the accompanying drawings in which like references indicate similar elements and in which.

DETAILED DESCRIPTION

A test circuit comprising differential comparators with a programmable voltage offset is disclosed. The test circuit provides a high accuracy testing system that allows the testing of both high speed differential outputs and high speed non-differential outputs. For one embodiment, devices examined by the test circuit include integrated circuits used in telecommunication applications and high speed microprocessors. For an alternative embodiment, the test circuit is also used in mixed signal applications. In mixed signal applications, the test circuit is used to digitize an integrated circuit's analog outputs. The digitized outputs are subsequently examined to determine the voltage values and timing specifications of the integrated circuit's outputs.

An intended advantage of an embodiment of the invention is to provide a high bandwidth test circuit that determines high, low, and float states for differential outputs of a DUT.

Another intended advantage of an embodiment of the invention is to provide a test circuit that provides accurate testing for differential DUT outputs with a common-mode component. The test circuit includes circuitry that allows a tester to compare the signal transitions of differential outputs while negating the effects of the common-mode component.

Another intended advantage of an embodiment of the invention is to provide a test circuit that detects differential amplitude errors. In particular, for a given differential output, provided one output has an incorrect voltage level, the test circuit detects a direct current ("DC") error.

Yet another intended advantage of an embodiment of the invention is to remove the capacitive coupling introduced during the testing of a pair of differential outputs. In particular, for one embodiment, the tester circuit provides two differential pin electronics that function independently of each other. Accordingly, the test circuit may be used to test single ended outputs and/or differential outputs without introducing capacitive coupling between the differential outputs.

Figures 1A, 1B:
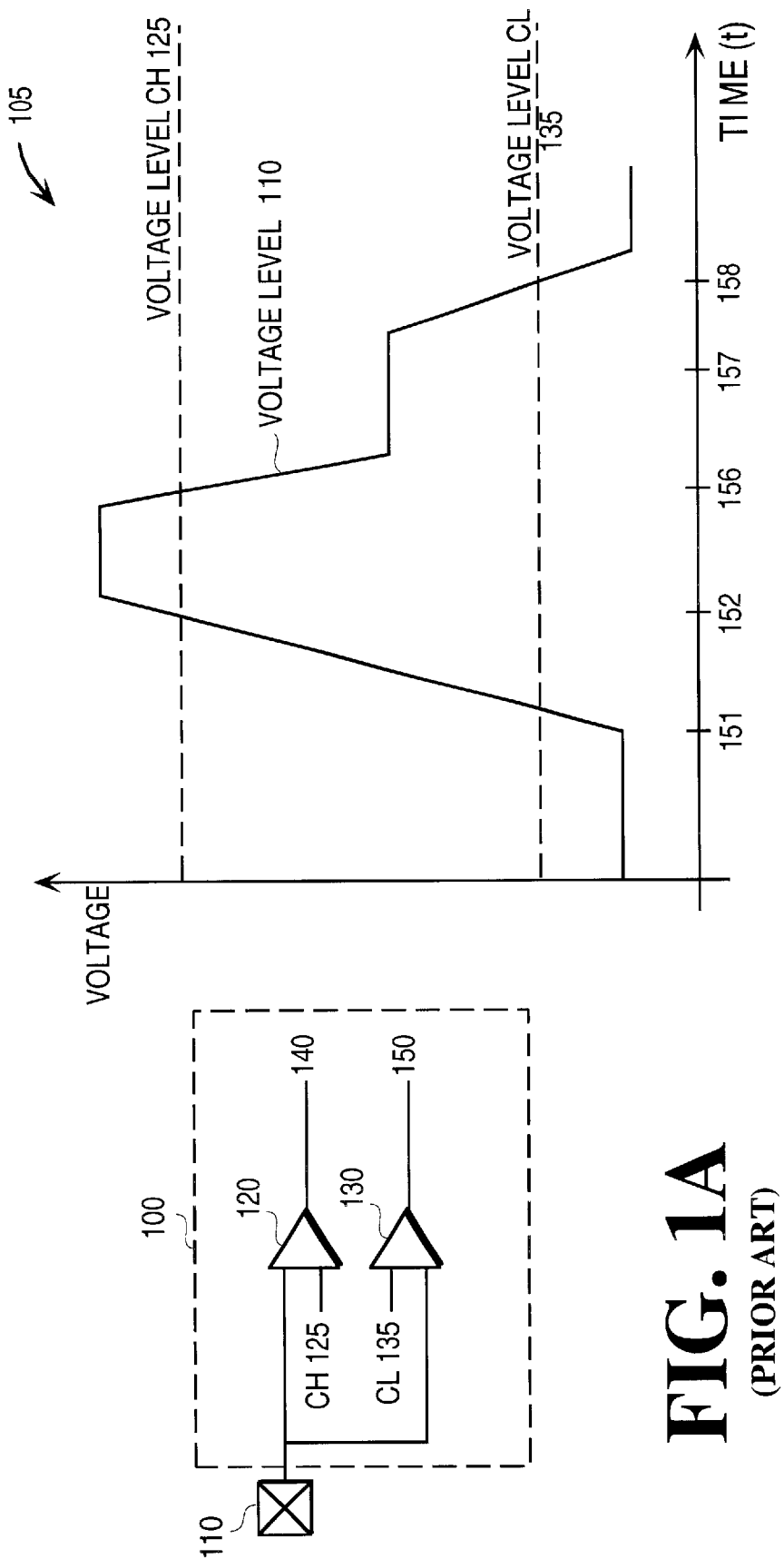
FIG. 1A illustrates a prior art testing circuit.
FIG. 1B illustrates the timing chart of a pin coupled to the prior art testing circuit of FIG. 1A.
Figure 2:
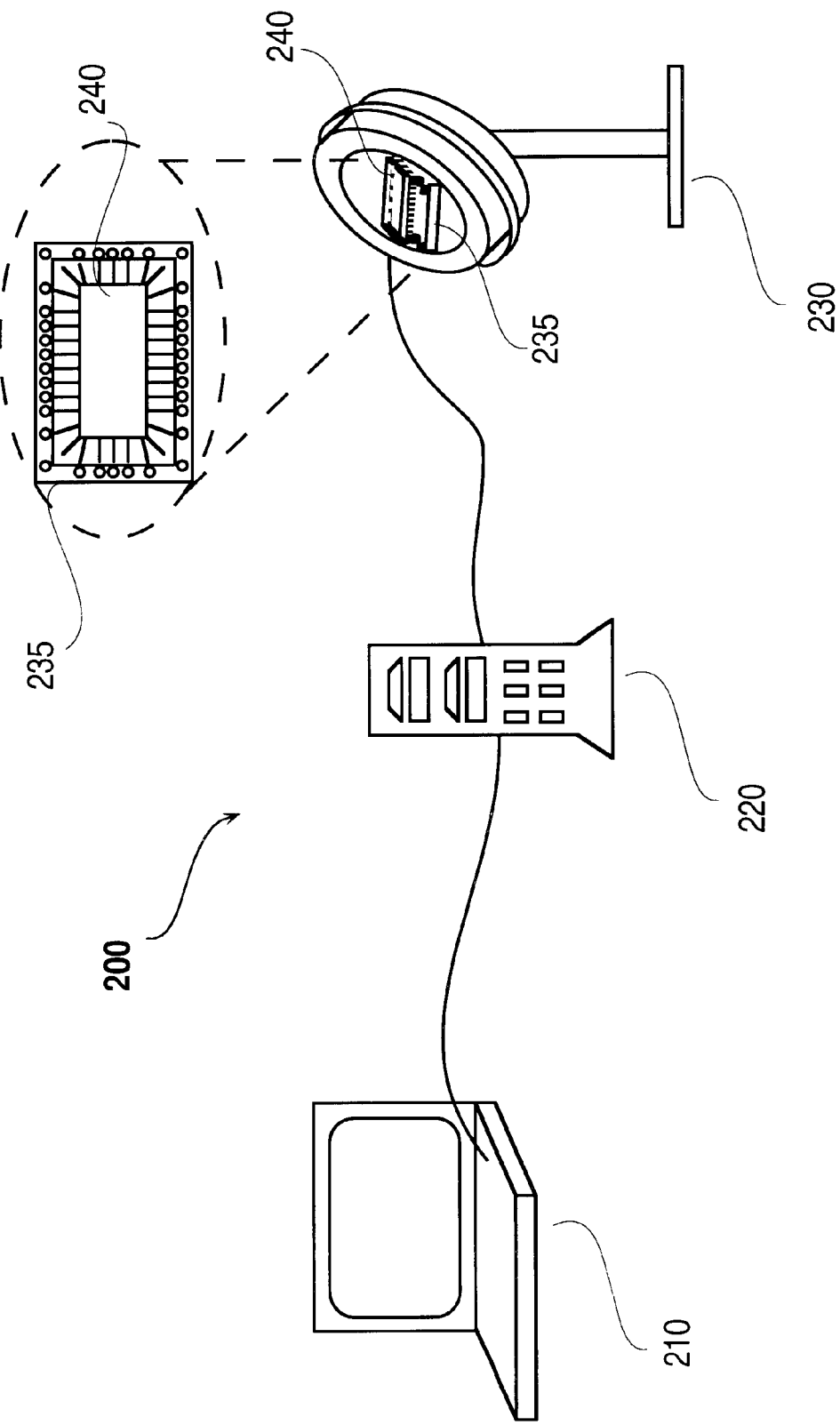
FIG. 2 shows one embodiment of a test circuit system.

FIG. 2 shows one embodiment of a test circuit system. In particular, test system 200 shows computer 210 coupled to diagnostic system 220. Diagnostic system 220, in turn, is coupled to testing base 230. Testing base 230 is used to orient and couple the pins of device under test ("DUT") 240 to interface circuit 235. As illustrated in FIG. 2, for one embodiment testing base 230 provides a platform that allows interface circuit 235 to directly connect to the pins of DUT 240. For one embodiment, interface circuit 235 includes two components. The first component includes drive circuits (not shown) used to drive DUT 240's input pins. The second component includes offsettable differential comparators (not shown) used to read DUT 240's output pins. Using interface circuit 235, test system 200 determines the input/output ("I/O") characteristics of DUT 240.

For one embodiment, computer 210 generates test vectors. The test vectors include a set of inputs used to excise the logic included in DUT 240. The test vectors also include a set of expected outputs. The expected outputs represent a desired output based on selected input values. Using the test vectors, test system 200 examines the I/O characteristics of DUT 240. In particular, diagnostic system 220 calibrates the input test vectors, via interface circuit 235, and applies the calibrated input signals to the input pins of DUT 240. Diagnostic system 220 also reads the output pins of DUT 240 via interface circuit 235. Subsequent to reading the DUT's output values, diagnostic system 220 compares the values on the output pins to the expected vector outputs. System 200 compares the values generated by DUT 240 to the expected outputs during a given time period. Accordingly, system 200 determines the timing specification of DUT 240's outputs. For one embodiment, DUT 240 comprises a digital microprocessor. For alternative embodiments, DUT 240 comprises mixed signal communication integrated circuits.

For one embodiment, test system 200 is coupled to a DUT with differential outputs. Accordingly, interface circuit 235 includes offsettable differential comparators to read the DUT's output pins. For one embodiment each differential output of the DUT is coupled to a single offsettable differential comparator. For an alternative embodiment, multiple differential outputs of the DUT are coupled to a single offsettable differential comparator through a multiplexing device that selects a particular DUT output for testing.

Figure 3:
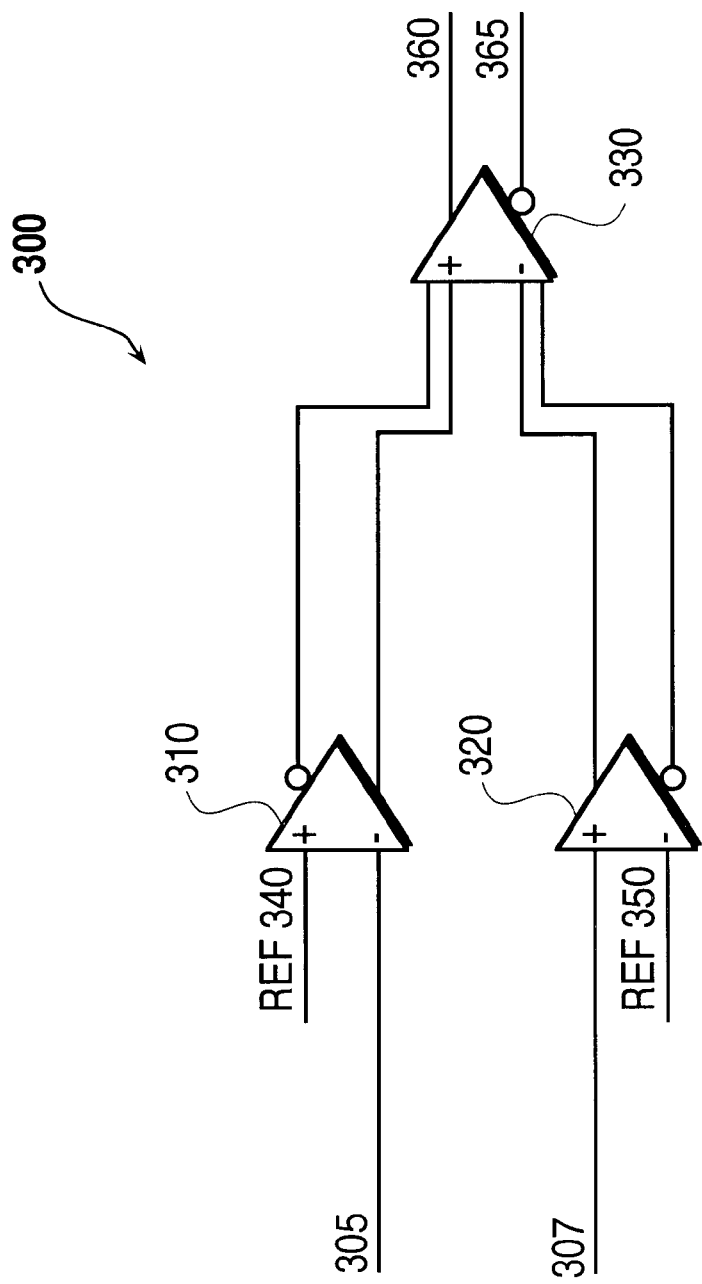
FIG. 3 shows one embodiment of a single offsettable differential comparator.

FIG. 3 shows one embodiment of an offsettable differential comparator. In particular, circuit 300 includes two inputs (305 and 307) and two outputs (360 and 365). Input 305 is coupled to an input of differential amplifier 310. The second input of differential amplifier 310 is coupled to REF 340. The outputs of differential amplifier 310 are coupled to differential comparator 330. Similarly, input 307 is coupled to an input of differential amplifier 320. The second input of differential amplifier 320 is coupled to REF 350 and the outputs of differential amplifier 320 are coupled to differential comparator 330. For one embodiment, differential amplifiers 310 and 320 comprise analog differential amplifiers with a bandwidth greater than one gigahertz ("GHz") bandwidth and a gain of less than one. For one embodiment, differential comparator 330 comprises a comparator with a gain greater than 5000.

Using the combination of the differential amplifiers (310 and 320), circuit 300 compares inputs 305 and 307 to REF 340 and REF 350, respectively. For one embodiment, REF 340 is a logic high voltage level recognized by system 200. Similarly, REF 350 is a logic low voltage level recognized by system 200.

As previously described, the outputs of differential amplifiers 310 and 320 are coupled to differential comparator 330. For one embodiment, the differential comparator 330 compares inputs 305 to input 307. In particular, the outputs of differential comparator 330 provides a digital signal describing the voltage relationship of inputs 305 and 307 to reference voltages REF 340 and REF 350, respectively. The outputs 360, 365 of differential comparator 330 follow the equation if (input 305−REF 340)>(input 307−REF 350) then output 360=1 else output 360=0

Alternatively, the equation states:

if (input 305−input 307)>(REF 340−REF 350) then output 360=1 else output 360=0

As illustrated in FIG. 3, output 365 is the logical inverse of output 360. Accordingly, output 365 follows the same equations as output 360, however, the value of output 365 is inverted for the same set of equations.

For one embodiment, a common mode component, Vcm, exists on a DUT's differential pair outputs. Accordingly, the outputs of differential comparator 330 follow the equation if (input 305+Vcm−[input 307+Vcm])>(REF 340−REF 350) then output 360=1 else output 360=0

Alternatively, the equation states:

if (input 305−input 307)>(REF 340−REF 350) then output 360=1 else output 360=0

Accordingly, the coupling between differential amplifier 310, differential amplifier 320, and differential comparator 330 allows circuit 300 to compare differential outputs on inputs 305 and 307 while negating the common mode offset. Thus, a test system using circuit 300 results in accurate output testing of a DUT despite a common mode voltage offset on the DUT's outputs.

For one embodiment, detection of a non-transitioning differential output is desired. For one embodiment the differential voltage swing of a DUT is plus or minus 2 volts. Accordingly, REF 340 and REF 350 are modified. In particular, REF 340 and REF 350 are modified so that REF 340 minus REF 350 equals 1.5 volts. Additionally, the differential outputs of the DUT are coupled to inputs 305 and 307. Provided the voltage difference between the inputs exceeds 1.5 volts, output 360 transitions from a high to low voltage. Similarly, provided the voltage difference between the inputs is below 1.5 volts, output 360 transitions from a low to high voltage. Provided one of the inputs is non-functional, however, output 360 will not transition. Thus, the modification of REF 340 and REF 350 allow a test system using circuit 300 to detect whether a differential output of a DUT has an incorrect voltage level.

For an alternative embodiment, a high bandwidth is desired to examine the high speed output transitions of a DUT. For one embodiment, in this case amplifiers 310 and 320 are designed with high speed JFETs to achieve a bandwidth greater than 1 GHz while maintaining a gain of less than 1. The use of the high speed JFETs limits the amplifier output swing to +/−2.5 volts. This limited output swing, in turn, limits common mode voltage error. This ensures, that the inputs to comparator 330 are operating in a linear region prior to and immediately after a transition point indicating a logic transition of the DUT's output. Thus, a test system using circuit 300 ensures accurate output testing of a DUT despite high speed voltage swings on the DUT's outputs. For yet another embodiment, comparator 330 includes bi-polar elements.

For one embodiment, circuit 300 is used to test a differential DUT output transitioning at a frequency of one gigahertz. For an alternative embodiment, differential amplifiers 310 and 320 are junction field effect transistors ("JFET") and differential comparator 330 includes bi-polar transistors. The JFET introduces a low gain while the bi-polar differential comparator provides high bandwidth.

Figure 4:
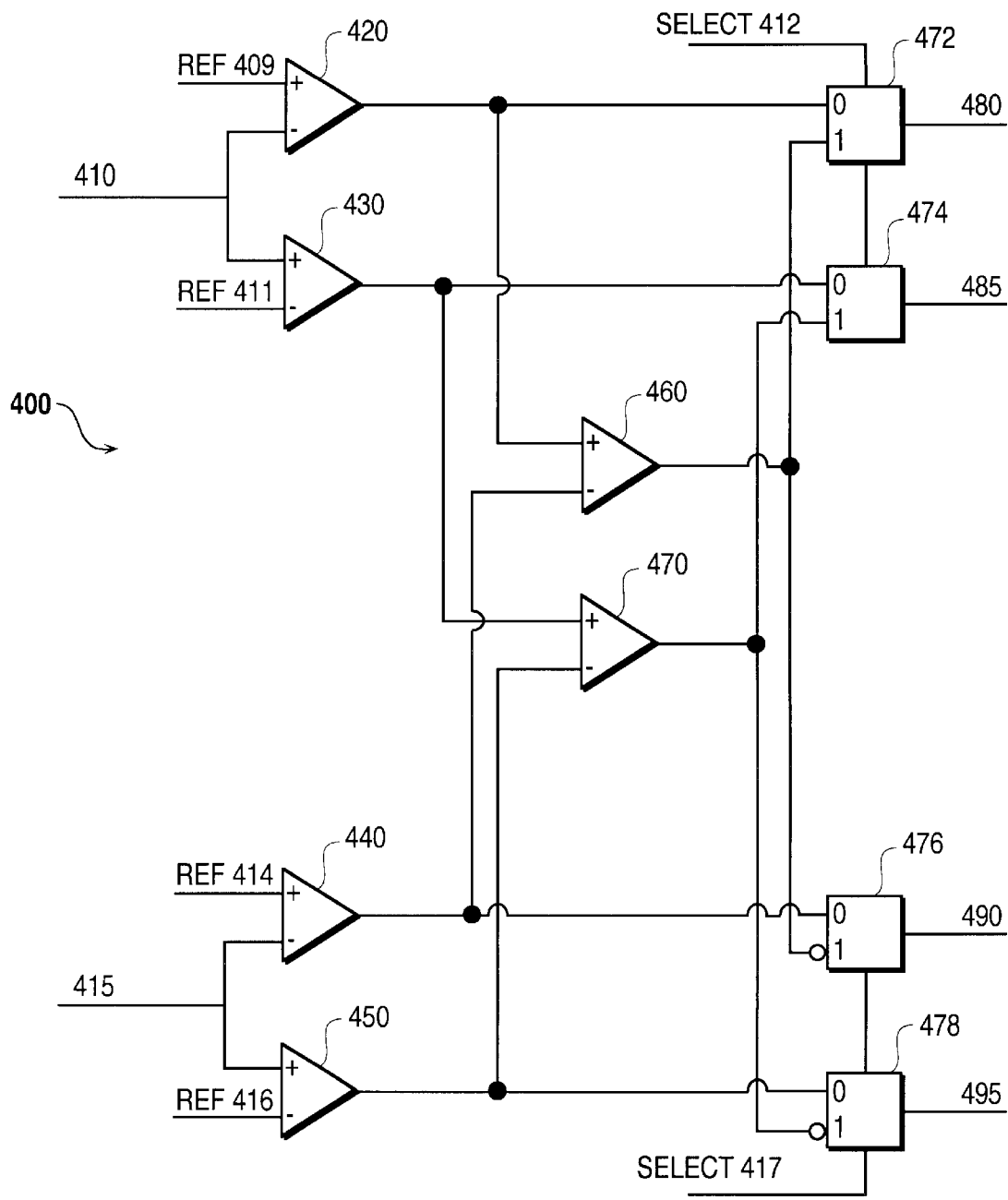
FIG. 4 shows one embodiment of a dual offsettable differential comparator.

FIG. 4 illustrates one embodiment of a dual offsettable differential comparator. In particular, circuit 400 is used in a two channel pin testing equipment to test the I/O characteristics of a differential pair and/or the I/O characteristics of two independent outputs. Circuit 400 includes two inputs (410 and 415) and four outputs (480, 485, 490, and 495). Each input of circuit 400 is coupled to a different set of amplifiers and comparators. Accordingly, circuit 400 does not introduce capacitive cross coupling between inputs. Additionally, circuit 400 includes multiplexing devices (472, 474, 476, and 478) coupled to outputs 480, 485, 490, and 495. The multiplexing devices provide circuit 400 with two testing modes. In the first testing mode, circuit 400 outputs a digital comparison of input 410 to reference voltages REF 409 and REF 411. In the first testing mode, circuit 400 also outputs a digital comparison of input 415 to reference voltages REF 414 and REF 416. In the second testing mode, circuit 400 determines whether a differential signal coupled to inputs 410 and 415 is in a high, a low, or a float state.

The symmetrical device coupling of circuit 400 provides for multiple testing features while reducing cross capacitance. As illustrated in FIG. 4, circuit 400 includes two inputs, inputs 410 and 415. Input 410 is coupled to the inputs of differential amplifier 420 and differential amplifier 430. The second inputs of differential amplifier 420 and differential amplifier 430 are coupled to reference voltages REF 409 and REF 411, respectively. The reference voltages allow circuit 400 to simultaneously compare a signal on input 410 to two reference voltages. The outputs of differential amplifier 420 and 430 are coupled to select logic 472 and select logic 474, respectively. Additionally, the outputs of differential amplifiers 420 and 430 are coupled to differential comparator 460 and differential comparator 470, respectively.

Input 415 is coupled to the inputs of differential amplifier 440 and differential amplifier 450. The second inputs of differential amplifier 440 and differential amplifier 450 are coupled to reference voltages REF 414 and REF 416, respectively. As previously described, the reference voltages allow circuit 400 to simultaneously compare a signal on input 415 to two reference voltages.

Following the coupling on input 410, the outputs of differential amplifiers 440 and 450 are coupled to select logic 476 and select logic 478, respectively. Additionally, the outputs of differential amplifiers 440 and 450 are coupled to differential comparator 460 and differential comparator 470, respectively. The symmetrical coupling of inputs 410 and 415 to their respective differential amplifiers and differential comparators provides similar capacitive loading on both inputs. The inputs, however, function as completely independent pin electronic channels during the first testing mode.

For one embodiment, circuit 400 is designed on a single integrated circuit and identical layouts are used to design the device coupled between the inputs (410 and 415) and outputs (480, 485, 490, and 495). Accordingly, circuit 400 provides similar propagation delay and gain for inputs 410 and 415. Thus, circuit 400 ensures similar testing accuracy between both inputs of a differential signal coupled to inputs 410 and 415. Additionally, circuit 400 ensures similar testing accuracy between two different inputs coupled to inputs 410 and 415.

For one embodiment, select 412 and select 417 are active high signals used to determine the testing mode of circuit 400. As illustrated in FIG. 4, select logics 472 and 474 are coupled to select 412. Also as illustrated in FIG. 4, select logics 476 and 478 are coupled to select 417. Accordingly, provided select 412 is a logic low the outputs of differential amplifiers 420 and 430 are coupled to outputs 480 and 485. Similarly, provided select 417 is a logic low the outputs of differential amplifiers 440 and 450 are coupled to outputs 490 and 495. The direct coupling of the differential amplifiers to the outputs corresponds to the first testing mode previously described and circuit 400 provides a comparison of inputs 410 and 415 to the reference voltages. For one embodiment, select logics 472, 474, 476, and 478 comprise two-to-one multiplexors. For an alternative embodiment, select logics 472, 474, 476, and 478 comprise combination logic used to selectively couple one of two inputs to a single output.

Provided select 412 is a logic high, however, the outputs of differential comparator 460 and differential comparator 470 are coupled to outputs 480 and 485. In particular, inputs 410 and 415 are offset by their respective reference voltages and compared against each other. For one embodiment, when select 412 is a logic high a DUT's differential outputs are coupled to inputs 410 and 415. Accordingly, circuit 400 performs the second testing mode previously described and determines whether the DUT's differential outputs are in a high, a low, or a float state.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A test circuit operable to examine outputs of a device under test (DUT), the circuit comprising:
    a first circuit having as inputs a first output of the DUT and a first set of one or more reference voltages and an output of the first circuit coupled to a plurality of comparators;
    a second circuit having as inputs a second output of the DUT and a second set of one or more reference voltages independent of the first set of one or more reference voltages, and an output of the second circuit coupled to the plurality of comparators; and
    a select circuit coupled to outputs of the comparators, the output of the first circuit and the output of the second circuit, the select circuit outputting the outputs of the first circuit and the second circuit or outputting the outputs of the comparators.

2. The test circuit of claim 1, wherein the select circuit comprises a multiplexing device.

3. The test circuit of claim 1, wherein the select circuit transitions the test circuit between testing a differential of the first and the second outputs of the DUT, and testing the outputs of the DUT independently.

4. The test circuit of claim 1, wherein the first circuit comprises a first and a second differential amplifier, each differential amplifier having a first terminal coupled to the first output of the DUT, and a second terminal coupled to a respective one of the first set of one or more reference voltages, an output of the first differential amplifier coupled as an input to a first comparator of the plurality of comparators, and an output of the second differential amplifier coupled as an input to a second comparator of the plurality of comparators.

5. The test circuit of claim 4, wherein the second circuit comprises a third and a fourth differential amplifier, each differential amplifier having a first terminal coupled to the second output of the DUT, and a second terminal coupled to a respective one of the second set of one or more reference voltages, an output of the third differential amplifier coupled as another input to the first comparator of the plurality of comparators, and an output of the fourth differential amplifier coupled as another input to the second comparator of the plurality of comparators.

6. The test circuit of claim 5, wherein each of the differential amplifiers has a gain less than one.

7. The test circuit of claim 5, wherein each of the comparators has a gain greater than five thousand.

8. The test circuit of claim 1, wherein the first circuit and the second circuit are configured to have matching propagation and gain properties.

9. A test system comprising:
    a computer;
    a diagnostic system coupled to the computer designed to evaluate data using the computer; and
    a testing base designed to send data to the diagnostic system for evaluation, the testing base including an interface circuit to interface with a device under test (DUT), wherein the interface circuit comprises:
        a plurality of independent pin electronics channels, each of the channels for testing signal pairs, each independent pin electronics channel comprising:
        a first circuit having as inputs a first output of the DUT and a first set of one or more reference voltages, and an output of the first circuit coupled to a plurality of comparators;
        a second circuit having as inputs a second output of the DUT and a second set of one or more reference voltages independent of the first set of one or more reference voltages, an output of the second circuit coupled to the plurality of comparators; and
        a select circuit coupled to outputs of the comparators, the output of the first circuit and the output of the second circuit, the select circuit outputting the outputs of the first circuit and the second circuit or outputting the outputs of the comparators.

10. The test system of claim 9, wherein the select circuit comprises a multiplexing device.

11. The test system of claim 9, wherein the select circuit transitions the test system between testing a differential of the first and the second outputs of the DUT, and testing the outputs of the DUT independently.

12. The test system of claim 9, wherein the first circuit comprises a first and a second differential amplifier, each differential amplifier having a first terminal coupled to the first output of the DUT, and a second terminal coupled to a respective one of the first set of reference voltages, an output of the first differential amplifier coupled as an input to a first comparator of the plurality of comparators, and an output of the second differential amplifier coupled as an input to a second comparator of the plurality of comparators.

13. The test system of claim 12, wherein the second circuit comprises a third and a fourth differential amplifier, each differential amplifier having a first terminal coupled to the second output of the DUT, and a second terminal coupled to a respective one of the second set of reference voltages, an output of the third differential amplifier coupled as another input to the first comparator, and an output of the fourth differential amplifier coupled as another input to the second comparator.

14. The test system of claim 13, wherein each of the differential amplifiers has a gain less than one.

15. The test system of claim 13, wherein each of the comparators has a gain greater than five thousand.

16. The test system of claim 13, wherein the differential amplifiers comprise analog differential amplifiers.

17. The test system of claim 13, wherein each of the comparators is a differential comparator and outputs a digital signal describing a voltage relationship of a first input signal to the comparator and a second input signal to the comparator.

18. The test system of claim 9, wherein the first set of reference voltages comprises two reference voltages, one of which is a logic high voltage, and the second is a logic low voltage.

19. The test system of claim 9, wherein the first circuit and the second circuit are configured to have matching propagation and gain properties.

20. A test circuit comprising:

a first amplifier having as inputs a first output of a device under test and a first set of one or more reference voltages, and an output of the first amplifier coupled to a plurality of comparators;

a second amplifier having as inputs a second output of the DUT and a second set of one or more reference voltages independent of the first set of one or more reference voltages an output of the second amplifier coupled to the plurality of comparators; and a select circuit coupled to outputs of the comparators, the output of the first amplifier and the output of the second amplifier, the select circuit outputting the outputs of the first amplifier and the second amplifier or outputting the outputs of the comparators.

21. The test circuit of claim 20, wherein the first amplifier and the second amplifier each comprise:

two differential amplifiers, each differential amplifier having a first terminal coupled to a respective output of the DUT, and a second terminal coupled to respective voltages of the first and second set of reference voltages, an output of a first differential amplifier coupled as an input to a first comparator of the plurality of comparators, and an output of a second differential amplifier coupled as an input to a second comparator of the plurality of comparators.

* * * * *